(12) United States Patent
Hirata

(10) Patent No.: US 8,658,985 B2
(45) Date of Patent: Feb. 25, 2014

(54) DRAWING APPARATUS AND METHOD OF MANUFACTURING ARTICLE

(75) Inventor: Yoshihiro Hirata, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/534,033

(22) Filed: Jun. 27, 2012

(65) Prior Publication Data

US 2013/0011796 A1    Jan. 10, 2013

(30) Foreign Application Priority Data

Jul. 6, 2011    (JP) ................................ 2011-150339

(51) Int. Cl.
    *H01J 37/302*    (2006.01)
(52) U.S. Cl.
    CPC ................................... *H01J 37/302* (2013.01)
    USPC ................................. 250/396 R; 250/492.22
(58) Field of Classification Search
    USPC ........................................ 250/396 R, 492.22
    See application file for complete search history.

(56) References Cited

U.S. PATENT DOCUMENTS

| 7,777,201 B2 * | 8/2010 | Fragner et al. | 250/491.1 |
| 8,115,183 B2 * | 2/2012 | Platzgummer | 250/492.2 |
| 8,258,484 B2 * | 9/2012 | Wieland et al. | 250/396 R |

FOREIGN PATENT DOCUMENTS

WO    2009/127659 A2    10/2009

* cited by examiner

*Primary Examiner* — Kiet T Nguyen
(74) *Attorney, Agent, or Firm* — Rossi, Kimms & McDowell LLP

(57) ABSTRACT

The present invention provides a drawing apparatus including a blanker including a plurality of deflectors configured to respectively deflect the plurality of charged particle beams, and a controller configured to transmit a control signal to the blanker, wherein the blanker includes a storage configured to store pattern data, a generator configured to generate, based on pattern information which is included in the control signal and designates the pattern data, and position information which is included in the control signal and designates a drawing position corresponding to the pattern information, a blanking signal for drawing a pattern corresponding to the pattern data stored in the storage at a position on a substrate corresponding to the position information, and a driving device configured to drive the plurality of deflectors in accordance with the generated blanking signal generated.

18 Claims, 5 Drawing Sheets

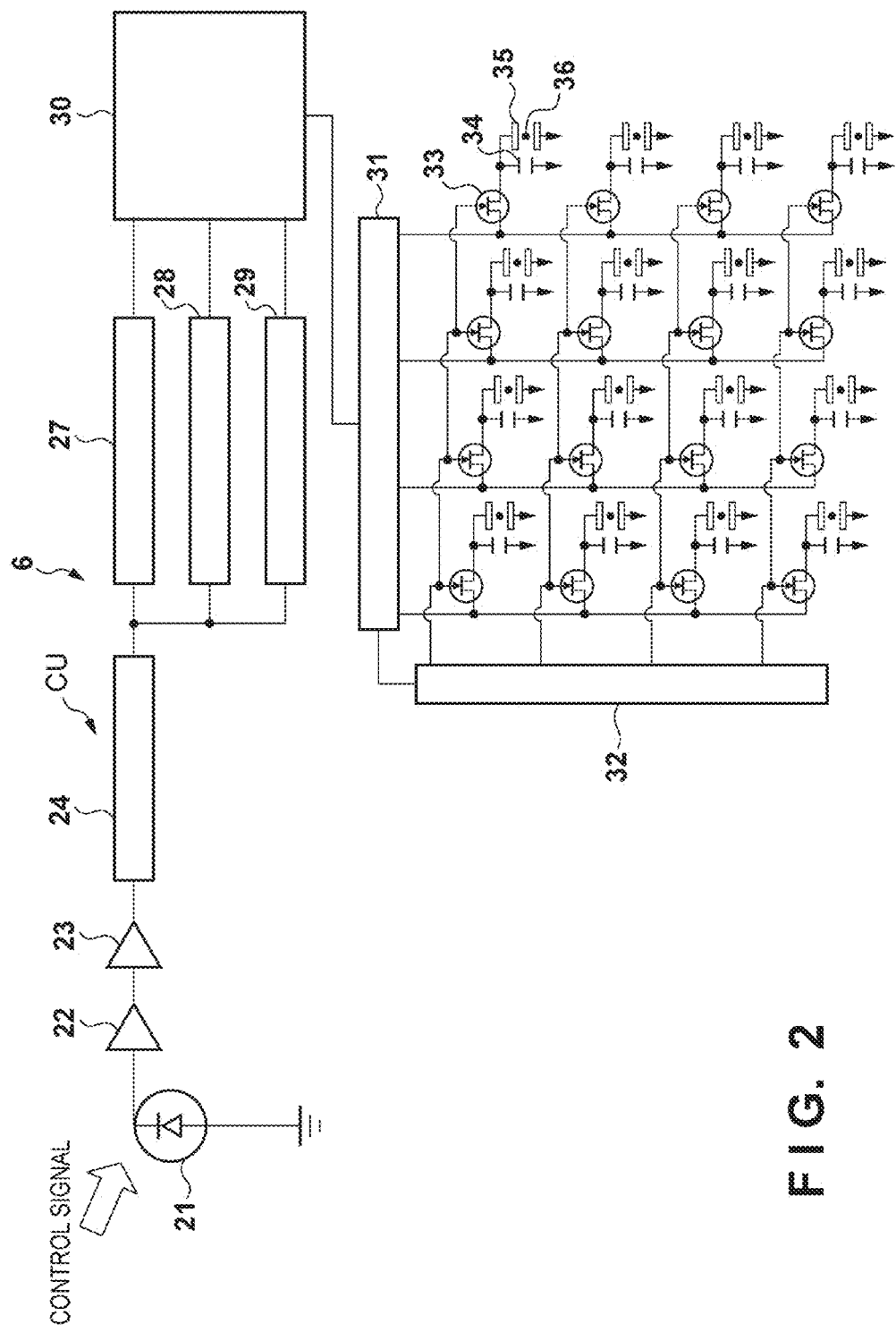
F I G. 2

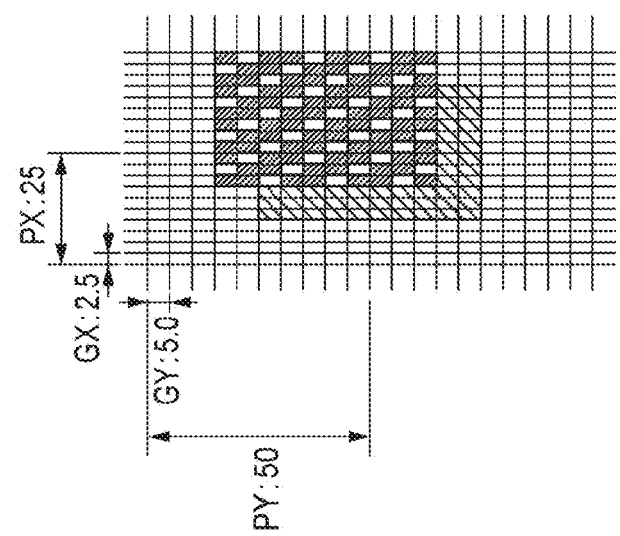
F I G. 3C
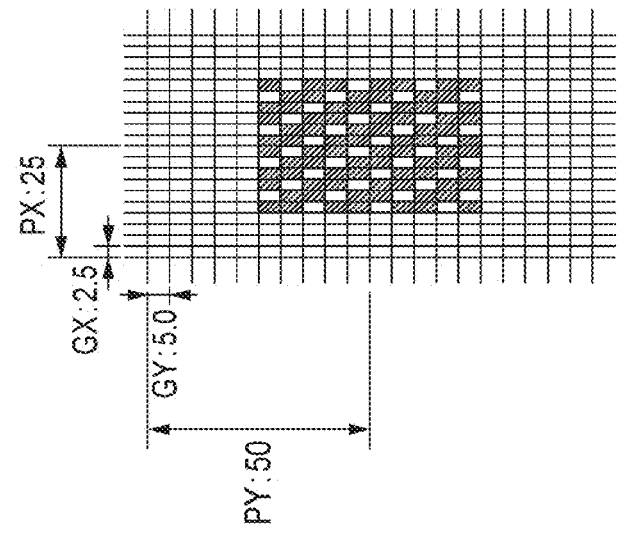
F I G. 3B
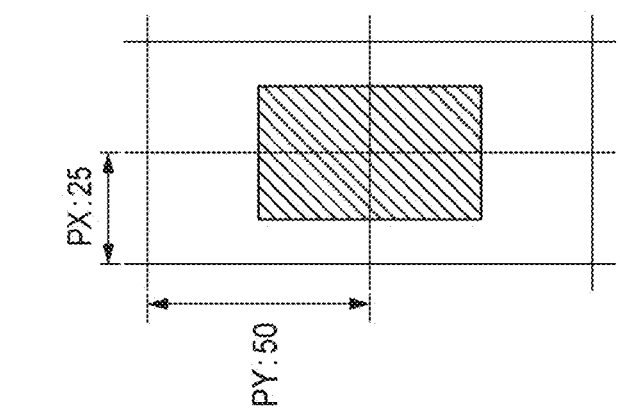
F I G. 3A

DRAWING APPARATUS AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

As one of apparatuses employed in a process of manufacturing, for example, a semiconductor device (lithography process), a so-called multiple charged particle beam drawing apparatus (charged particle beam exposure apparatus) which draws (transfers) a pattern on a substrate with a plurality of charged particle beams has been proposed in the International Publication No. 2009/127659.

The drawing apparatus controls blanking of each of a plurality of charged particle beams (switching between ON and OFF of the irradiation of the substrate) in accordance with a pattern (drawing pattern) to be drawn on the substrate by a blanker (blanking deflector array), thereby drawing the pattern on the substrate. Also, ON/OFF of the irradiation of the substrate with the charged particle beams is generally controlled for each drawing grid (one charged particle beam drawing range). Therefore, a blanking control unit supplies (transmits) a control signal for controlling a blanking deflector to the blanking deflector via an optical communication fiber for each drawing grid.

A communication unit provided in a blanking deflector BD receives a blanking deflector control signal, as shown in FIG. 5. The communication unit includes a photodiode 1021, transfer impedance amplifier 1022, limiting amplifier 1023, and serial/parallel converter (SERDES) 1024. A control signal (optical signal) from the fiber is received by the photodiode 1021, is converted from a current into a voltage by the transfer impedance amplifier 1022, and undergoes amplitude control by the limiting amplifier 1023. A signal from the limiting amplifier 1023 is input to the SERDES 1024 and converted from a serial signal into a parallel signal.

A transistor (FET) 1033 is placed at the intersection between a horizontally running gate electrode line and a vertically running source electrode line, and two bus lines are connected to the gate and source of the FET 1033, as shown in FIG. 5. The FET 1033 has its drain connected to an electrode 1035 and capacitor 1034 of the deflector, and has a common electrode on the side opposite to these two capacitive elements. With this arrangement, an active-matrix driving type blanking deflector which uses an FET as a switch can simultaneously apply voltages to a large number of FETs via gate electrode lines, thus increasing the number of electrodes while the number of lines is kept small.

However, in a multiple charged particle beam drawing apparatus, as the number of charged particle beams and the drawing frequency increase, the data rate of a control signal transmitted from an optical communication fiber to a blanking deflector rises. To draw a drawing pattern having a half pitch of 22 nm on, for example, 10 or more substrates per unit time, optical communication fibers which exhibit a transmission rate of 10 Gbps are necessary to form 5,000 or more channels (ch). Also, a communication unit provided in a blanking deflector normally consumes a power of several mW/Gps/ch. Therefore, when optical communication fibers which exhibit a transmission rate of 10 Gbps are necessary to form more than 5,000 channels (ch), the communication unit consumes a power of at least 50 W or more and, normally, several hundred watts. A blanking deflector is placed in a lens barrel of a charged particle optical system (electron optical system) which guides a charged particle beam onto a substrate. The interior of the lens barrel of the charged particle optical system is maintained in a high-vacuum environment, and therefore has a limit in the space which can be equipped with a cooling structure. This makes it difficult to remove heat generated by the communication unit in an amount corresponding to a power consumption of several hundred watts. As a result, the heat generated by the communication unit may produce geometric strain (distortion) in the blanking deflector (electrode) to a degree that cannot be ignored in terms of drawing accuracy.

SUMMARY OF THE INVENTION

The present invention provides, for example, a technique advantageous in reducing thermal distortion of a blanker.

According to one aspect of the present invention, there is provided a drawing apparatus which performs drawing on a substrate with a plurality of charged particle beams, the apparatus including a blanker including a plurality of deflectors configured to respectively deflect the plurality of charged particle beams, and a controller configured to transmit a control signal to the blanker, the blanker including a storage configured to store pattern data for drawing a pattern to be drawn on the substrate, a generator configured to generate, based on pattern information which is included in the control signal and designates the pattern data, and position information which is included in the control signal and designates a drawing position corresponding to the pattern information, a blanking signal for drawing a pattern corresponding to the pattern data stored in the storage at a position on the substrate corresponding to the position information, and a driving device configured to drive the plurality of deflectors in accordance with the blanking signal generated by the generator.

Further features of the present invention will become apparent from the following description of exemplary embodiments with reference to the attached drawings.

BRIEF DESCRIPTION OF THE DRAWINGS

FIG. 2 is a circuit diagram showing details of the configuration of a blanking deflector in the drawing apparatus shown in FIG. 1.

FIGS. 3A to 3C are views for explaining a process of generating a blanking signal by a generation unit in the drawing apparatus shown in FIG. 1.

DESCRIPTION OF THE EMBODIMENTS

Figure 1:
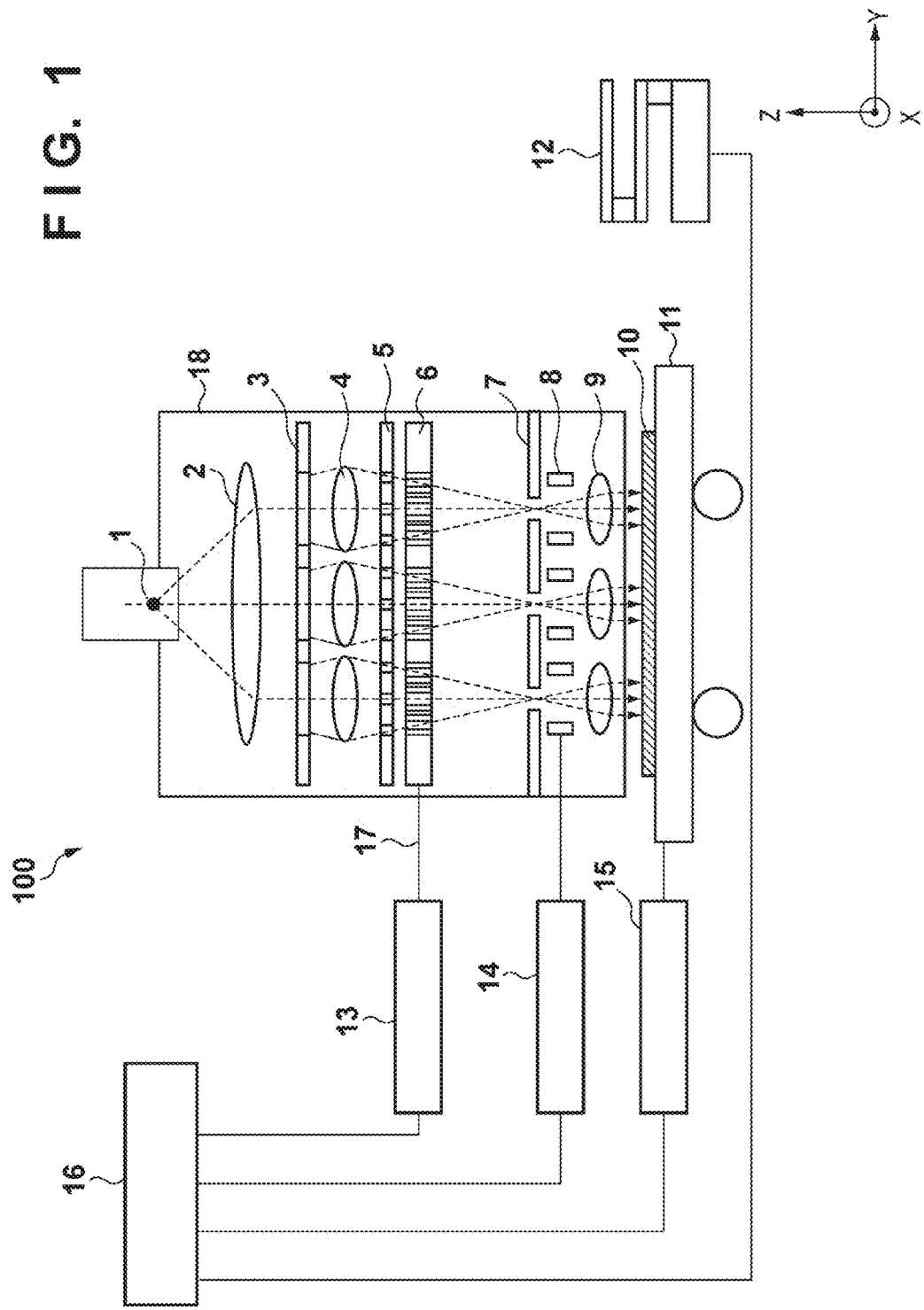
FIG. 1 is a view showing the configuration of a drawing apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a view showing the configuration of a drawing apparatus 100 according to an aspect of the present invention. The drawing apparatus 100 draws a pattern on a substrate using a plurality of charged particle beams (electron beams).

An electron source 1 is a thermoelectron type electron source such as $LaB_6$ or BaO/W (dispenser cathode). A collimator lens 2 is an electrostatic lens which converges a charged particle beam using an electric field. In this embodiment, the collimator lens 2 converts a charged particle beam from the electron source 1 into a nearly collimated charged particle beam.

A plurality of apertures are two-dimensionally arrayed (formed) in an aperture array 3. A condenser lens array 4 is formed by two-dimensionally arraying electrostatic condenser lenses having the same optical power. An aperture array 5 is formed by arraying sub-arrays, in which apertures which define the shapes of charged particle beams are arrayed, in a number corresponding to the number of condenser lenses which form the condenser lens array 4. Note that the aperture array 3 has a function of defining the irradiation ranges of charged particle beams on a substrate 10.

The nearly collimated charged particle beam from the collimator lens 2 is divided into a plurality of charged particle beams by the aperture array 3. The plurality of charged particle beams divided by the aperture array 3 illuminate the corresponding sub-arrays of the aperture array 5 via the corresponding condenser lenses of the condenser lens array 4.

A blanking deflector (blanker) 6 includes a plurality of deflectors (for example, electrostatic blankers) which deflect the plurality of charged particle beams, and turns on/off the irradiation of the substrate 10 with the charged particle beams upon driving of the plurality of deflectors. A blanking aperture array 7 is formed by arraying blanking apertures each including one opening, in a number corresponding to the number of condenser lenses which form the condenser lens array 4.

A deflector array 8 is formed by arraying deflectors, which deflect the charged particle beams in arbitrary directions, in a number corresponding to the number of condenser lenses which form the condenser lens array 4. An objective lens array 9 is formed by arraying electrostatic objective lenses in a number corresponding to the number of condenser lenses which form the condenser lens array 4.

The substrate 10 is a substrate onto which a pattern is to be transferred, and includes, for example, a wafer or a glass plate. A substrate stage 11 is a stage which moves upon holding the substrate 10, and positions the substrate 10 at a predetermined position. An electrostatic chuck for holding (fixing) the substrate 10, and a measurement device for measuring the positions of the charged particle beams, for example, are arranged on the substrate stage 11. A substrate transport unit 12 is a mechanism which loads the substrate 10 onto the substrate stage 11 or unloads the substrate 10 from the substrate stage 11.

The charged particle beams having passed through each sub-array of the aperture array 5 further pass through the corresponding deflectors of the blanking deflector 6, the corresponding blanking aperture of the blanking aperture array 7, the corresponding deflector of the deflector array 8, and the corresponding objective lens of the objective lens array 9. In other words, the charged particle beams having passed through the sub-arrays of the aperture array 5 are guided onto the substrate 10 via the blanking deflector 6, blanking aperture array 7, deflector array 8, and objective lens array 9. Therefore, in the drawing apparatus 100 according to this embodiment, the aperture array 5 (its each sub-array) is the object plane, and the substrate 10 is the image plane.

Also, when the deflectors of the blanking deflector 6 corresponding to the charged particle beams having passed through each sub-array of the aperture array 5 are driven (that is, when these deflectors deflect the corresponding charged particle beams), these charged particle beams are blocked by the blanking aperture array 7 to prevent (limit) their incidence on the substrate 10. On the other hand, when the deflectors of the blanking deflector 6 corresponding to the charged particle beams having passed through each sub-array of the aperture array 5 are not driven, these charged particle beams pass through the blanking aperture array 7 and scan on the substrate 10 while they are deflected in the same amount by the corresponding deflector of the deflector array 8.

A charged particle beam from the electron source 1 forms an image on the blanking aperture array 7 via the collimator lens 2 and condenser lens array 4, and its size is set larger than that of each aperture of the blanking aperture array 7. Therefore, the incident angle of the charged particle beams on the substrate 10 is defined by the apertures of the blanking aperture array 7.

Also, each aperture of the blanking aperture array 7 is set at the front focus position of the corresponding objective lens of the objective lens array 9. Therefore, the principal ray of the charged particle beams having passed through the plurality of apertures of each sub-array of the aperture array 5 perpendicularly enters the substrate 10, so the variations in position of the charged particle beams are kept small even if the substrate 10 moves vertically (in the optical axis direction).

A blanking control unit 13 has a function of individually controlling the plurality of deflectors which form the blanking deflector 6. In this embodiment, the blanking control unit 13 transmits a control signal for controlling the blanking deflector 6 to the blanking deflector 6 via an optical communication fiber 17. A deflector control unit 14 has a function of commonly controlling the plurality of deflectors which form the deflector array 8. A stage control unit 15 has a function of controlling driving of the substrate stage 11 in cooperation of a laser interferometer (not shown) which detects the position of the substrate stage 11. A main control unit 16 includes, for example, a CPU and memory and controls the overall drawing apparatus 100 (its operation) via, for example, the blanking control unit 13, deflector control unit 14, and stage control unit 15.

The control signal from the blanking control unit 13 is input to the blanking deflector 6 via the optical communication fiber 17. The control signal from one optical communication fiber 17 controls the deflector of the blanking deflector 6 corresponding to one objective lens of the objective lens array 9. In other words, the control signal from one optical communication fiber 17 controls ON/OFF of the irradiation of the substrate with the charged particle beams having passed through the plurality of deflectors arranged in one sub-array of the aperture array 5.

FIG. 2 is a circuit diagram showing details of the configuration of the blanking deflector 6. The blanking deflector 6 includes, for example, a communication unit CU, storage unit 27, correction information storage unit 28, shift register 29, and generation unit 30, as shown in FIG. 2. The storage unit 27 stores pattern data representing a drawing pattern which forms at least part of a pattern to be drawn on the substrate 10. The correction information storage unit (compensation information storage unit) 28 stores correction information (information which includes the amounts of various types of alignment and serves to correct (compensate) the positions of the convergence points of the plurality of charged particle beams on the substrate 10) for correcting (compensating) position offsets of the plurality of charged particle beams on the substrate 10. The shift register 29 holds, for example, a control signal transmitted from the blanking control unit 13 and, more specifically, position information included in the control signal. The position information means herein information which designates the drawing pattern drawing position. Also, the control signal includes instruction information for instructing to use the pattern data, stored in the storage unit 27, in generating a blanking signal indicating ON or OFF of the irradiation of the substrate 10 with the charged particle beams by the plurality of deflectors which form the blanking deflector 6. The generation unit 30 obtains the position information included in the control signal in accordance with the instruction information included in the control signal, and generates, from the pattern data stored in the storage unit 27, a blanking signal for drawing a drawing pattern at the drawing position designated in the obtained position information.

The communication unit CU provided in the blanking deflector 6 receives the control signal (optical signal) transmitted from the blanking control unit 13, as shown in FIG. 2. The communication unit CU includes a photodiode 21, transfer impedance amplifier 22, limiting amplifier 23, and serial/parallel converter (SERDES) 24. The control signal from the blanking control unit 13 is received by the photodiode 21, is converted from a current into a voltage by the transfer impedance amplifier 22, and undergoes amplitude control by the limiting amplifier 23. A signal from the limiting amplifier 23 is input to the SERDES 24 and converted from a serial signal into a parallel signal.

The shift register 29 holds the position information included in the control signal received by the communication unit CU. The shift register 29 can hold a plurality of pieces of position information in the order of reception by the communication unit CU (in the order of drawing in accordance with the sequence of scanning of the charged particle beams). Also, the position information indicates, for example, whether a drawing pattern is to be drawn (that is, the presence/absence of the drawing pattern) for each drawing grid indicating the drawing range of each of the plurality of charged particle beams on the substrate 10.

In this embodiment, the storage unit 27 stores pattern data representing a dithered drawing pattern in advance. The pattern data is desirably pattern data with high repeatability, such as that representing cut patterns for cutting linear patterns formed on the substrate 10 or that representing hole patterns.

Also, the storage unit 27 can store a plurality of types of pattern data representing a plurality of types of drawing patterns. In such a case, the generation unit 30 obtains identification information for identifying a plurality of types of drawing patterns included in the control signal from the blanking control unit 13. The generation unit 30 then selects pattern data representing a drawing pattern identified based on the obtained identification information from a plurality of types of pattern data stored in the storage unit 27 to generate a blanking signal from the selected pattern data.

Moreover, the storage unit 27 stores various types of pattern data in descending order of use frequency or repeatability. This makes it possible to shorten the time required for the generation unit 30 to select (read out) pattern data stored in the storage unit 27.

Again, the storage unit 27 can rewrite the pattern data via the communication unit CU under the control of the blanking control unit 13. In other words, the storage unit 27 stores pattern data to be rewritable. This makes it possible to keep the memory capacity of the storage unit 27 low (that is, this obviates the need for the memory capacity to store mass pattern data), and, in turn, to keep the storage unit 27 at a size small enough to place it in the blanking deflector 6. Also, the correction information stored in the correction information storage unit 28 can be rewritten, via the communication unit CU under the control of the blanking control unit 13.

A process of generating a blanking signal by the generation unit 30 will be described with reference to FIGS. 3A to 3C. The pattern data stored in the storage unit 27 is assumed herein to be pattern data representing a two-dimensional drawing pattern having (PX, PY) as a drawing position unit (the interval of the drawing pattern), as shown in FIG. 3A.

First, a control signal from the blanking control unit 13 is received by the communication unit CU. If the control signal includes instruction information, position information and identification information included in the control signal are held in the shift register 29. The position information means herein information indicating the presence/absence of the drawing pattern for each drawing position unit (PX, PY) in each drawing grid.

The generation unit 30 obtains the position information and identification information from the shift register 29. The generation unit 30 selects pattern data representing a drawing pattern identified based on the obtained identification information from a plurality of types of pattern data stored in the storage unit 27. Also, the generation unit 30 generates, from the selected pattern data, a blanking signal for drawing the drawing pattern identified based on the obtained identification information at the drawing position designated in the obtained position information. More specifically, when the drawing pattern reaches the drawing position (the position at which the drawing pattern is present) designated in the position information, the generation unit 30 generates a blanking signal based on the pattern data selected from those stored in the storage unit 27, as shown in FIG. 3B. At this time, the generation unit 30 generates a blanking signal dithered for each drawing grid unit (GX, GY) smaller than the drawing pattern drawing position unit (PX, PY).

The generation unit 30 corrects the generated blanking signal so as to reduce position offsets of the charged particle beams for drawing the drawing pattern, based on the correction information stored in the correction information storage unit 28, and the position information held in the shift register 29, as shown in FIG. 3C. At this time, position offsets of the charged particle beams are corrected for each drawing grid unit (GX, GY) smaller than the drawing pattern drawing position unit (PX, PY). More specifically, the timing at which a blanking signal is generated is changed to change the timing at which the substrate 10 is irradiated or not irradiated with the charged particle beams, thereby correcting position offsets of the charged particle beams on the substrate 10. Note that when a region that falls outside the drawing ranges of the charged particle beams must be corrected, the charged particle beams which draw in these ranges need only be corrected.

Although position offsets of the charged particle beams are corrected after pattern data representing a drawing pattern is expanded into drawing grid units in this embodiment, the present invention is not limited to this. For example, the pattern data may be expanded into drawing grid units after a position offset of each charged particle beam is corrected, or expansion of the pattern data and correction of position offsets of the charged particle beams may be done simultaneously. Also, although dithered pattern data is stored in the storage unit 27 in this embodiment, non-dithered pattern data may be stored in the storage unit 27 and dithered by the generation unit 30.

The generation unit 30 transmits a blanking signal to a driving device, which includes, for example, a data driver 31 and gate driver 32 and drives the plurality of deflectors forming the blanking deflector 6, at the timing corresponding to the blanking time interval (drawing cycle). The blanking deflector 6 adopts the active-matrix driving type which uses a transistor (FET) as a switch, as shown in FIG. 2. More specifically, an FET 33 is placed at the intersection between a horizontally running gate electrode line and a vertically running source electrode line, and two bus lines are connected to the gate and source of the FET 33. The FET 33 has its drain connected to an electrode 35 and capacitor 34 of the deflector, and has a common electrode on the side opposite to these two capacitive elements. A voltage applied to a gate electrode line turns on all FETs 33 on one row connected to this gate electrode line. Upon this operation, a current flows between the sources and the drains of the FETs 33, and voltages applied to the source electrode lines are applied to the electrodes 35, so charges corresponding to the voltages are stored in the capacitors 34. After charge of capacitors 34 on one row ends, a voltage is applied to the next gate electrode line, so the FETs 33 connected to the preceding gate electrode line applied with the voltage lose gate voltages and are turned off. The electrodes 35 connected to the FETs 33 in an "OFF operation" lose the voltages from the source electrode lines, but can maintain required voltages until a gate electrode line is selected in accordance with the charges stored in the capacitors 34 (for a given period of time). In this embodiment, 4 (rows)×4 (columns) electrodes 35 are arranged, and a blanking signal from the generation unit 30 is input to the data driver 31 so that voltages are applied to the gate electrodes of the FETs 33 via the source electrodes. Also, all FETs 33 on one row are turned on via the gate driver 32 to control the electrodes 35 on this row. Blanking signals from the generation unit 30 are sequentially input to the data driver 31 to turn on all FETs 33 on the next row via the gate driver 32 to control the 4 (rows)×4 (columns) electrodes 35 (blanking deflector 6).

In this embodiment, a control signal (position information and identification information) is transmitted from the blanking control unit 13 to the blanking deflector 6 for each drawing pattern drawing position unit larger than a drawing grid unit, instead of transmitting a control signal from the blanking control unit 13 to the blanking deflector 6 for each drawing grid (related art technique). Based on the position information and identification information, a blanking signal is generated for each drawing pattern drawing position unit. Upon this operation, in this embodiment, no control signal is transmitted from the blanking control unit 13 to the blanking deflector 6 at the charged particle beam scanning time interval between the drawing grids, unlike the related art technique. In other words, a control signal is transmitted from the blanking control unit 13 to the blanking deflector 6 at the charged particle beam scanning time interval between the drawing pattern drawing positions.

Hence, in this embodiment, the time interval at which control signal transmission occurs (that is, the cycle in which a control signal is transmitted) prolongs so that the control signal data rate can be reduced, compared to the related art technique. This makes it possible to suppress heat generation by the communication unit CU (that is, reduce geometric strain (distortion) generated in the blanking deflector 6), thus allowing the drawing apparatus 100 to maintain excellent drawing accuracy.

As shown in, for example, FIGS. 3A and 3B, when the drawing pattern drawing position unit (PX, PY) is set to (25 µm, 50 µm), and the drawing grid unit (GX, GY) is set to (2.5 µm, 5.0 µm), their area ratio is 100. In this case, when the blanking time interval is the same (the throughput is the same), the number of times of control signal transmission which occurs between the blanking control unit 13 and the blanking deflector 6 in this embodiment can be as small as 1/100 that in the related art technique.

For the sake of simplicity, when a blanking signal in each drawing grid is assumed to have 1-bit data required for blanking, blanking signals in 100 drawing grids have 100-bit data required for blanking. On the other hand, when 1,000 types of drawing patterns are assumed to be present, identification information for identifying these drawing patterns has 14 bits. Also, when position information indicating the presence/absence of the drawing pattern for each drawing position unit (PX, PY) in each drawing grid is assumed to have 1 bit, the control signal including the identification information and position information has a total of 15 bits. Therefore, the control signal data rate in this embodiment can be as low as 15/100 that in the related art technique.

Also, the blanking control unit 13 may sequentially transmit control signals including position information and identification information to the blanking deflector 6, in synchronism with the timings at which the plurality of deflectors of the blanking deflector 6 are driven. In this case, the generation unit 30 generates blanking signals in synchronism with the timings of the control signals sequentially transmitted from the blanking control unit 13.

Moreover, the blanking control unit 13 may sequentially transmit control signals including position information and identification information to the blanking deflector 6 at timings earlier than those at which the blanking deflector 6 is driven. The shift register 29 can hold the control signals sequentially transmitted from the blanking control unit 13, as described above. Therefore, the generation unit 30 can read the control signals from the shift register 29 to generate blanking signals, in synchronism with the timings at which the plurality of deflectors of the blanking deflector 6 are driven. In this case, the control signal data rate temporarily rises, but the average control signal data rate can reduce.

The drawing apparatus 100 according to this embodiment can reduce the control signal data rate between the blanking control unit 13 and the blanking deflector 6 to suppress heat generation by the communication unit CU. It is also possible to keep the mounting volume of a transmission path between the blanking control unit 13 and the blanking deflector 6 low. Hence, the drawing apparatus 100 can maintain excellent drawing accuracy and provide a high-quality device (for example, a semiconductor integrated circuit device or a liquid crystal display device) as articles with a high throughput and good economic efficiency. Note that the device is manufactured through a step of drawing a pattern on a substrate (for example, a wafer or a glass plate) coated with a photoresist (photosensitive agent) using the drawing apparatus 100, a step of developing the substrate having the pattern drawn on it, and subsequent known steps.

Figure 4B:
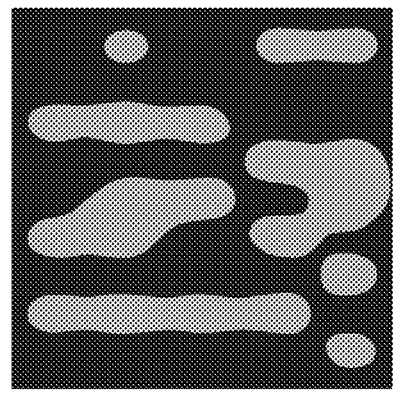
FIGS. 4A and 4B are views for explaining how the drawing apparatus shown in FIG. 1 draws cut patterns.
Figure 4A:
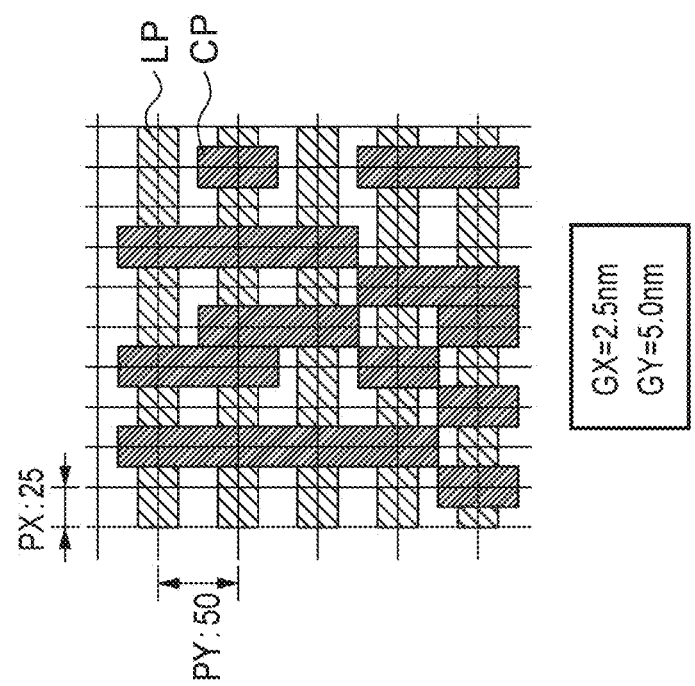
Figure 5:
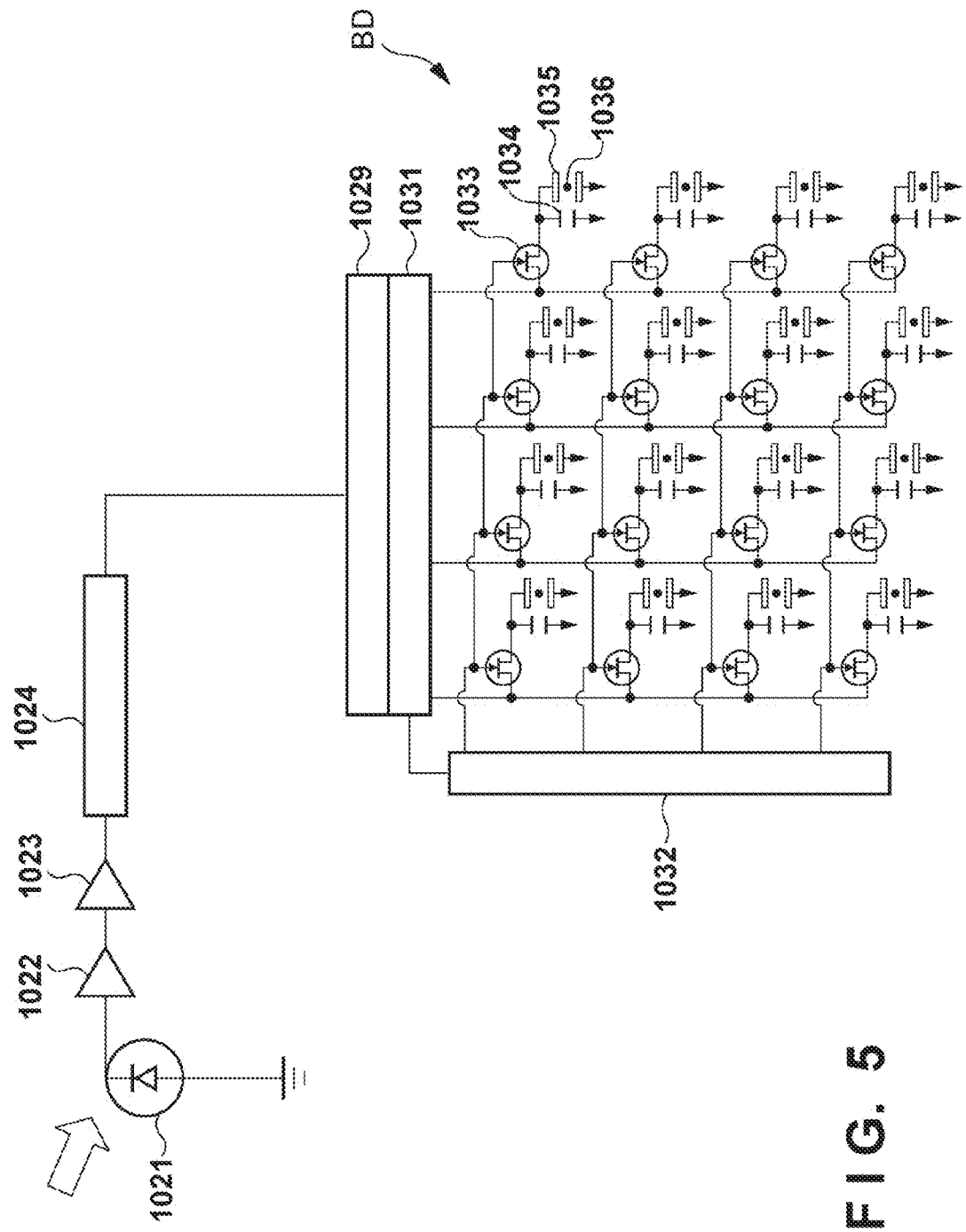
FIG. 5 is a circuit diagram for explaining how to control a blanking deflector.

The drawing apparatus 100 according to this embodiment is suitable especially when the same drawing pattern is repeatedly drawn and, for example, when cut patterns are drawn. FIGS. 4A and 4B are views for explaining how the drawing apparatus 100 draws cut patterns CP. However, the drawing apparatus 100 is suitable for other drawing patterns having high repeatability, such as the hole patterns (contact holes or VIA holes) of a logic pattern.

As shown in FIG. 4A, in drawing the cut patterns CP, linear patterns LP having the Y-axis direction as their longitudinal direction, for example, are formed on the substrate 10 in advance. In this case, the linear patterns LP are formed on the substrate 10 at a pitch of 50 nm in the X-axis direction. The cut patterns CP are drawn so as to cut the linear patterns LP.

Referring to FIG. 4A, the drawing position unit (PX, PY) of the cut pattern CP is (25 nm, 50 nm), and the drawing grid unit (GX, GY) is (2.5 nm, 5.0 nm). First, a control signal transmitted from the blanking control unit 13 for each drawing position unit of the cut pattern CP is received by the communication unit CU, and position information included in the control signal is held in the shift register 29. Also, the generation unit 30 obtains the position information held in the shift register 29 to generate, from pattern data representing the cut pattern CP stored in the storage unit 27, a blanking signal for drawing the cut pattern CP at the drawing position designated in this position information. At this time, based on the correction information stored in the correction information storage unit 28, and the position information held in the shift register 29, the generated blanking signal is corrected so as to reduce position offsets of the charged particle beams for drawing the cut pattern CP. The generation unit 30 transmits a blanking signal to the driving device, which includes, for example, the data driver 31 and gate driver 32 and drives the plurality of deflectors forming the blanking deflector 6, at the timing corresponding to the blanking time interval (drawing cycle). FIG. 4B is a view showing the result (resist image) of drawing the cut patterns CP while driving the plurality of deflectors forming the blanking deflector 6 in accordance with the blanking signals generated by the generation unit 30. As can be seen from FIG. 4B, the cut patterns CP to be isolated can be isolated satisfactorily and drawn so as not to hinder subsequent steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-150339 filed on Jul. 6, 2011, which is hereby incorporated by reference herein in its entirety.

What is claimed is:

1. A drawing apparatus which performs drawing on a substrate with a plurality of charged particle beams, the apparatus comprising:
   a blanker including a plurality of deflectors configured to respectively deflect the plurality of charged particle beams; and
   a controller configured to transmit a control signal to the blanker,
   the blanker including
   a storage configured to store pattern data corresponding to a pattern to be drawn on the substrate,
   a generator configured to generate, based on pattern information which is included in the control signal and designates the pattern data, and position information which is included in the control signal and designates a drawing position corresponding to the pattern information, a blanking signal for drawing a pattern corresponding to the pattern data stored in the storage at a position on the substrate corresponding to the position information, and
   a driving device configured to drive the plurality of deflectors in accordance with the blanking signal generated by the generator.

2. The apparatus according to claim 1, wherein
   the storage is configured to store, as the pattern data, a plurality of types of pattern data, and
   the pattern information includes a plurality of types of pattern information respectively corresponding to the plurality of types of pattern data.

3. The apparatus according to claim 1, wherein an interval of the patterns drawn on the substrate is larger than an interval of a drawing grid defined by the plurality of charged particle beams on the substrate.

4. The apparatus according to claim 1, wherein
   the blanker includes a compensation information storage configured to store compensation information for compensating for a position error of each of the plurality of charged particle beams on the substrate, and
   the generator is configured to generate the blanking signal, based on the compensation information stored in the compensation information storage, so as to compensate for the position error.

5. The apparatus according to claim 1, wherein
   the controller is configured to sequentially transmit the control signal to the blanker in accordance with a timing at which the driving device drives the plurality of deflectors, and
   the generator is configured to generate the blanking signal in accordance with the control signal sequentially transmitted from the controller.

6. The apparatus according to claim 1, wherein
   the blanker includes a register configured to hold the control signal transmitted from the controller, and
   the generator configured to read the control signal from the register, in accordance with a timing at which the driving device drives the plurality of deflectors, to generate the blanking signal.

7. The apparatus according to claim 1, wherein the storage is configured to store the pattern data in a rewritable manner.

8. The apparatus according to claim 1, wherein the storage is configured to store, as the pattern data, at least one of pattern data for drawing a hole pattern and pattern data for cutting a linear pattern formed on the substrate.

9. A method of manufacturing an article, the method comprising:
   performing drawing on a substrate using a drawing apparatus;
   developing the substrate on which the drawing has been performed; and
   processing the developed substrate to manufacture the article, wherein the drawing apparatus performs the drawing with a plurality of charge particle beams, the apparatus including:
   a blanker including a plurality of deflectors configured to respectively deflect the plurality of charged particle beams; and
   a controller configured to transmit a control signal to the blanker,
   the blanker including
   a storage configured to store pattern data corresponding to a pattern to be drawn on the substrate,
   a generator configured to generate, based on pattern information which is included in the control signal and designates the pattern data, and position information which is included in the control signal and designates a drawing position corresponding to the pattern information, a blanking signal for drawing a pattern corresponding to the pattern data stored in the storage at a position on the substrate corresponding to the position information, and
   a driving device configured to drive the plurality of deflectors in accordance with the blanking signal generated by the generator.

10. A drawing apparatus which performs drawing on a substrate with a plurality of charged particle beams, the apparatus comprising:
    a blanker including a plurality of blanking devices configured to respectively blank the plurality of charged particle beams; and
    a controller configured to transmit a control signal to the blanker,
    the blanker including
    a storage configured to store pattern data corresponding to a pattern to be drawn on the substrate,
    a generator configured to generate, based on pattern information which is included in the control signal and designates the pattern data, and position information which is included in the control signal and designates a drawing position corresponding to the pattern information, a blanking signal for drawing a pattern corresponding to the pattern data stored in the storage at a position on the substrate corresponding to the position information, and a driving device configured to drive the plurality of blanking devices in accordance with the blanking signal generated by the generator.

11. The apparatus according to claim 10, wherein the storage is configured to store, as the pattern data, a plurality of types of pattern data, and the pattern information includes a plurality of types of pattern information respectively corresponding to the plurality of types of pattern data.

12. The apparatus according to claim 10, wherein an interval of the patterns drawn on the substrate is larger than an interval of a drawing grid defined by the plurality of charged particle beams on the substrate.

13. The apparatus according to claim 10, wherein the blanker includes a compensation information storage configured to store compensation information for compensating for a position error of each of the plurality of charged particle beams on the substrate, and the generator is configured to generate the blanking signal, based on the compensation information stored in the compensation information storage, so as to compensate for the position error.

14. The apparatus according to claim 10, wherein the controller is configured to sequentially transmit the control signal to the blanker in accordance with a timing at which the driving device drives the plurality of blanking devices, and the generator is configured to generate the blanking signal in accordance with the control signal sequentially transmitted from the controller.

15. The apparatus according to claim 10, wherein the blanker includes a register configured to hold the control signal transmitted from the controller, and the generator configured to read the control signal from the register, in accordance with a timing at which the driving device drives the plurality of blanking devices, to generate the blanking signal.

16. The apparatus according to claim 10, wherein the storage is configured to store the pattern data in a rewritable manner.

17. The apparatus according to claim 10, wherein the storage is configured to store, as the pattern data, at least one of pattern data for drawing a hole pattern and pattern data for cutting a linear pattern formed on the substrate.

18. A method of manufacturing an article, the method comprising:

performing drawing on a substrate using a drawing apparatus;

developing the substrate on which the drawing has been performed; and processing the developed substrate to manufacture the article, wherein the drawing apparatus performs the drawing with a plurality of charge particle beams, the apparatus including:

a blanker including a plurality of blanking devices configured to respectively blank the plurality of charged particle beams; and a controller configured to transmit a control signal to the blanker, the blanker including a storage configured to store pattern data corresponding to a pattern to be drawn on the substrate, a generator configured to generate, based on pattern information which is included in the control signal and designates the pattern data, and position information which is included in the control signal and designates a drawing position corresponding to the pattern information, a blanking signal for drawing a pattern corresponding to the pattern data stored in the storage at a position on the substrate corresponding to the position information, and a driving device configured to drive the plurality of blanking devices in accordance with the blanking signal generated by the generator.

* * * * *